(12) United States Patent
Nishihara (10) Patent No.: US 9,761,916 B2
(45) Date of Patent: Sep. 12, 2017

(54) POWER SUPPLY DEVICE, CIRCUIT BOARD, AND VEHICLE AND STORAGE BATTERY DEVICE EQUIPPED WITH POWER SUPPLY DEVICE

(71) Applicant: SANYO ELECTRIC CO., LTD., Osaka (JP)

(72) Inventor: Yoshitomo Nishihara, Osaka (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 290 days.

(21) Appl. No.: 14/364,342

(22) PCT Filed: Nov. 27, 2012

(86) PCT No.: PCT/JP2012/080659
§ 371 (c)(1),
(2) Date: Jun. 11, 2014

(87) PCT Pub. No.: WO2013/099499
PCT Pub. Date: Jul. 4, 2013

(65) Prior Publication Data
US 2014/0329121 A1   Nov. 6, 2014

(30) Foreign Application Priority Data
Dec. 28, 2011   (JP) .................................. 2011-289998

(51) Int. Cl.
*H01M 10/48*   (2006.01)
*H01M 2/10*   (2006.01)
(Continued)

(52) U.S. Cl.
CPC ...... *H01M 10/482* (2013.01); *G01R 31/3696* (2013.01); *H01M 2/1077* (2013.01);
(Continued)

(58) Field of Classification Search
CPC .. H01M 10/482; H01M 2/206; H01M 10/425; H01M 10/4257; H01M 2010/4271; G01R 31/36
(Continued)

(56) References Cited

U.S. PATENT DOCUMENTS

2010/0271036 A1   10/2010   Kishimoto et al.
2011/0101920 A1*   5/2011   Seo ..................... B60L 11/1861
320/127
(Continued)

FOREIGN PATENT DOCUMENTS

JP   2005-216532   8/2005
JP   2009-054480   3/2009
(Continued)

OTHER PUBLICATIONS

International Search Report dated Jan. 29, 2013 in International (PCT) Application No. PCT/JP2012/080659.

*Primary Examiner* — James Lee
(74) *Attorney, Agent, or Firm* — Wenderoth, Lind & Ponack, L.L.P.

(57) ABSTRACT

A power supply device has a first monitoring portion monitoring one battery property of plural battery cells constituting a battery block, a second monitoring portion monitoring another battery property, a circuit board having a monitoring circuit monitoring states of the battery cells being connected to the first and second monitoring portions and based on battery property information detected in the first and second monitoring portions and having a rectangular shape in the external appearance, a first connector connecting a first harness extended from the first monitoring portion to the circuit board, and a second connector connecting a second harness extended from the second monitoring portion to the circuit board. The first connector is fixed to one side of the circuit board, and the second connector is fixed to another (Continued)

side crossing the one side of the rectangular outer shape at a position thereof crossing the second connector.

12 Claims, 10 Drawing Sheets

(51) Int. Cl.
    *H01M 2/20*     (2006.01)
    *H01M 10/42*     (2006.01)
    *G01R 31/36*     (2006.01)

(52) U.S. Cl.
    CPC ......... *H01M 2/206* (2013.01); *H01M 10/425* (2013.01); *H01M 10/4257* (2013.01); *H01M 2220/20* (2013.01)

(58) Field of Classification Search
    USPC .......................................... 429/90; 324/437
    See application file for complete search history.

(56) References Cited

U.S. PATENT DOCUMENTS

| | | |
|---|---|---|
| 2011/0244282 A1 | 10/2011 | Seto et al. |
| 2012/0019061 A1 | 1/2012 | Nishihara et al. |
| 2012/0161677 A1 | 6/2012 | Kunimitsu et al. |

FOREIGN PATENT DOCUMENTS

| | | |
|---|---|---|
| JP | 2010-257750 | 11/2010 |
| JP | 2011-086634 | 4/2011 |
| JP | 2011-216400 | 10/2011 |
| WO | 2010/113455 | 10/2010 |
| WO | 2011/024477 | 3/2011 |

\* cited by examiner

POWER SUPPLY DEVICE, CIRCUIT BOARD, AND VEHICLE AND STORAGE BATTERY DEVICE EQUIPPED WITH POWER SUPPLY DEVICE

TECHNICAL FIELD

The present invention relates to a power source device having a plurality of stacked battery cells, to a circuit board, and to a vehicle and a storage battery device equipped with the power source device, in particular, to a power source device installed in an electric vehicle such as a hybrid vehicle, fuel-cell vehicle, electric vehicle, or electric autobike; or to a power source device configured to supply high current such as in a home or industrial power storage application.

BACKGROUND ART

Figure 10:
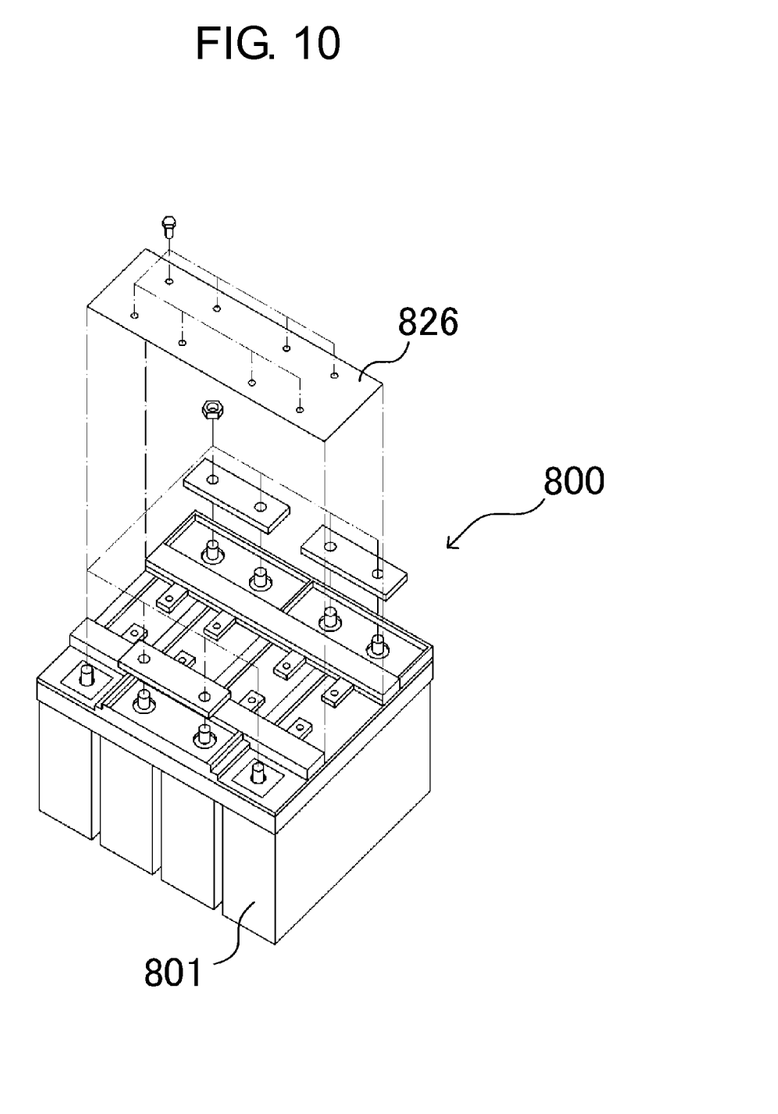
FIG. 10 is an exploded perspective view showing a prior art power supply device.

A power source device with a plurality of battery cells is used, for example, in automotive applications as the power source in a vehicle such as a hybrid vehicle or electric vehicle. This type of power source device is made up of battery blocks having a plurality of stacked battery cells. Further, an electric circuit board is positioned on the upper surface of the battery blocks. This circuit board has a monitoring circuit which monitors a temperature, a voltage, or the like, and detects whether or not abnormalities happen. One example of such power source device is shown in a perspective view of FIG. 10 (Patent Literature 1). In a power source device 800 shown in this figure, a circuit board 826 is fixed by screws on the upper surface of stacked structure of prismatic battery cells 801. In addition, each of the battery cells 801 is connected to a temperature sensor or a voltage sensor. The circuit board 826 is connected to harnesses extended from the temperature sensor and the voltage sensor connected to each of the battery cells 801.

According to the demands on the enhancement of capacity, as the number of secondary battery cells increase, the number of harnesses extended from the temperature sensor and the voltage sensor connected to the battery cells are increasing. On the other hand, as there are the demands on downsizing the power source device, it is difficult to increase in the size of the circuit board.

In the harnesses extended from such sensors and connected to the circuit board, in order to enhance noise immunity, shortening the length of the harnesses is required. Accordingly, the harnesses are connected to the side of the circuit board. However, under circumstances of both increasing the number of the sensors and not permitting increasing in the size of the circuit board, as shown in a plan view of FIG. 11, the connectors have to be disposed side by side. In the example of this figure, a first connector 965 is disposed at the side of a circuit board 926, and a second connector 966 is disposed at the inside of the first connector 965.

Figure 12:
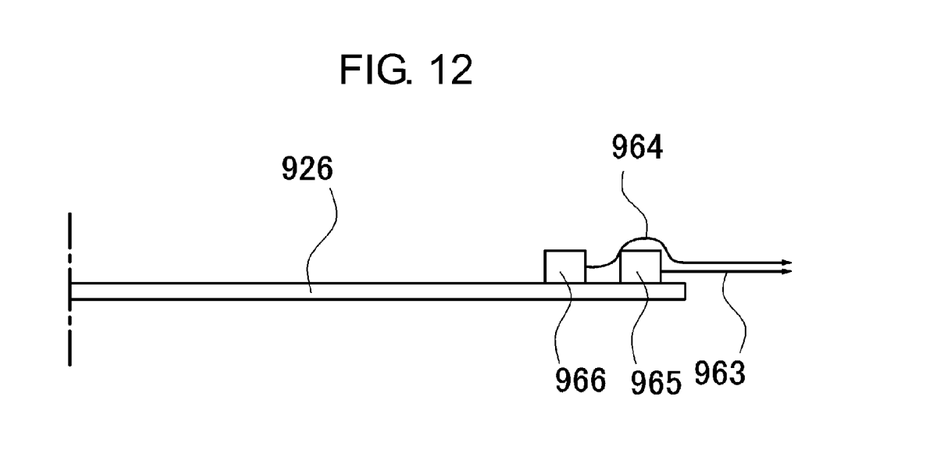
FIG. 12 is a side view of the circuit board in FIG. 11.

In such disposition, a first harness extended from the first connector 965 can be connected by the conventional example, but a second harness 964 extended from the second connector 966 disposed at the inside of the first connector 965 is extended to the outside beyond the upper surface of the first connector 965 as shown in a side view of FIG. 12. In this structure, the second harness 964 extended from the second connector 966 interferes with the connector 965 at the side.

Figure 11:
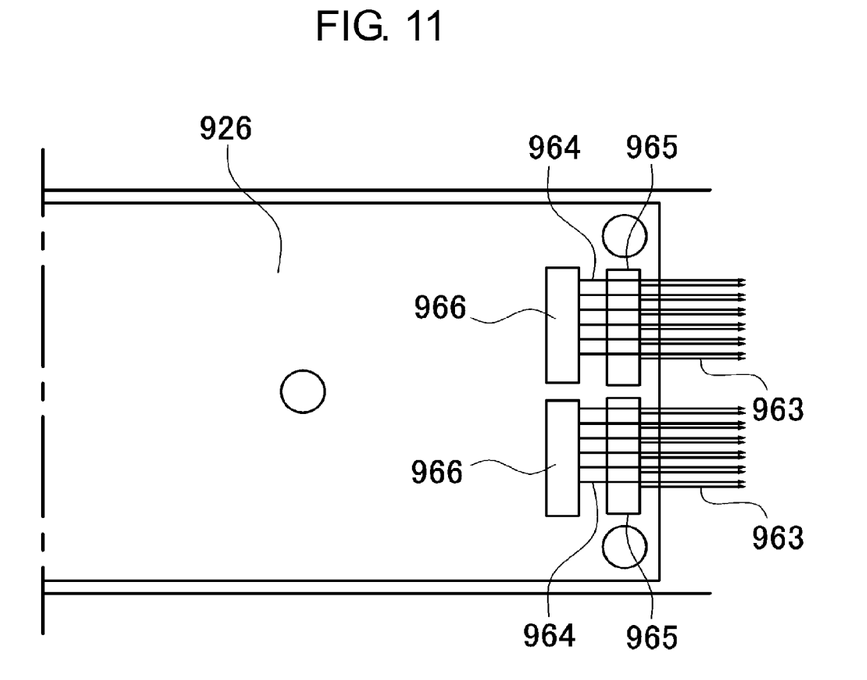
FIG. 11 is a plan view showing a circuit board of a conventional power supply device.

In order to avoid this interfering, when the second harness 964 is extended from the first connector 965 upward, a space which stores the second harness 964 is necessary at the upper portion from the first connector 965. Then, as the space in the direction of the height in the circuit board is necessary, as a result, the height of the power source device can be big. In addition to the direction of the height, in the horizontal direction, as shown in FIG. 11 and FIG. 12, in order that the second harness 964 is extended, it is necessary that the second connector 966 is disposed in spaced relationship with the first connector 965. Namely, it is difficult that the second connector 966 and the first connector 965 are not adjacently disposed. As a result, a large area in the circuit board where the connectors or the harnesses are disposed is necessary, and then it increases in the size of the power source device. Especially, in the resent trend of downsizing the power source device including its height, when such enlargement or increasing in the height is not permitted, there is a trouble in disposing the harnesses.

CITATION LIST

Patent Literature

Patent Literature 1: Japanese Laid-Open Patent Publication No. 2011-86634
Patent Literature 2: Japanese Laid-Open Patent Publication No. 2010-257750

SUMMARY OF THE INVENTION

The present disclosure is developed for the purpose of solving such drawbacks. One non-limiting and explanatory embodiment provides a power supply device, a circuit board, a vehicle and a storage battery device equipped with the power supply device which are able to avoid increasing in the size of the power source device even though the number of harnesses increase.

A power supply device of the present disclosure comprises a battery block having a plurality of stacked battery cells, a first monitoring portion monitoring one battery property of the plurality of the battery cells constituting the battery block, a second monitoring portion monitoring another battery property of the plurality of the battery cells constituting the battery block, a circuit board having a monitoring circuit monitoring states of the battery cells being connected to the first monitoring portion and the second monitoring portion based on each of battery property information detected in the first monitoring portion and the second monitoring portion and having a rectangular shape in the external appearance, a first connector connecting a first harness extended from the first monitoring portion to the monitoring circuit, and at least one second connector connecting a second harness extended from the second monitoring portion to the monitoring circuit. The first connector is fixed to one side of the rectangular shape in the circuit board, and the second connector is fixed to another side crossing the one side of the rectangular shape at a position thereof crossing the first connector. Accordingly, the monitoring portions can be connected using not only the one side but also another side adjacent to the one side. Therefore, even though the number of the monitoring portions is increased, those are efficiently disposed.

In the power supply device of the present disclosure, the battery property information is at least one of a temperature or a voltage of the battery cells 1. Accordingly, while monitoring the battery cells based on the temperature or the voltage, the connecters are compactly disposed.

In the power supply device of the present disclosure, the circuit board 26 has an elongated rectangular shape in one direction in the rectangular shape, and the first connector 65 is positioned at an end side in the elongated direction, and the second connector is positioned at a side adjacent to the end side in the elongated direction. Accordingly, while the first connector is positioned in the elongated direction and the first harness is extended, the second harness adjacent to it can be efficiently disposed such that the second harness does not interfere with the first connector.

In the power supply device of the present disclosure, a plurality of the second connectors are provided at facing sides of the circuit board. Accordingly, as the second connector are provided at both ends of the first connector, by using the plural second connectors, more monitoring circuits can be provided.

In the power supply device of the present disclosure, the second harness and the first harness are bent in the same direction. Accordingly, as the second harness extended from the second connector is collectively bent in the same direction as the first connector extended from the first connector, the harnesses can be easily disposed.

A circuit board of the present being connectable at least two monitoring portions monitoring battery property, comprises a monitoring circuit monitoring states of the battery cells being connectable at least two monitoring portions based on battery property information detected in each monitoring portion, a first connector connecting a first harness extended from the one monitoring portion to the circuit board, and a second connector connecting a second harness extended from the one other monitoring portion to the circuit board. The circuit board has a rectangular shape in the external appearance, and the first connector is fixed to one side of the rectangular shape in the circuit board, and the second connector is fixed to another side crossing the one side of the rectangular shape at a position thereof crossing second connector. Accordingly, the monitoring portions can be connected using not only the one side but also another side adjacent to the one side. Therefore, even though the number of the monitoring portions is increased, those are efficiently disposed.

A vehicle of the present disclosure comprises the above power supply device.

A storage battery device of the present disclosure comprises the above power supply device

DESCRIPTION OF EMBODIMENTS

Hereinafter, the embodiment of the present invention will be described referring to drawings. However, the following embodiments illustrate a power supply device, a circuit board, a vehicle and a storage battery device equipped with the power supply device which are aimed at embodying the technological concept of the present invention, and the present invention is not limited to the power supply device, the circuit board, the vehicle and the storage battery device equipped with the power supply device described below. Furthermore, in this specification, reference numbers corresponding to members illustrated in the embodiments are added to members illustrated in "Claims" and "Means of Solving the Problems" for the better understanding of Claims. However, the members illustrated in Claims are not limited to the members in the embodiments. In particular, as long as specific descriptions are not provided, it is not intended that the claims be limited to sizes, materials, shapes, and relative arrangements of constitutional members described in the embodiments, which are mere descriptive examples. It is noted that the magnitude or positional relation of the members illustrated in each diagram is sometimes grandiloquently represented, in order to clarify the description. Furthermore, in the description below, identical names and reference numbers represent identical or homogeneous members, and detailed descriptions are appropriately omitted. Moreover, mode may be applied where each element constituting the present invention constitutes a plurality of elements with the use of the same member, thereby serving the plurality of elements with the use of one member, or, in contrast, mode may be realized where a function of the one member is shared by a plurality of members. Also, a portion of examples and the content described in the embodiments can be applied to other examples and another embodiment.

Embodiment 1

Figure 1:
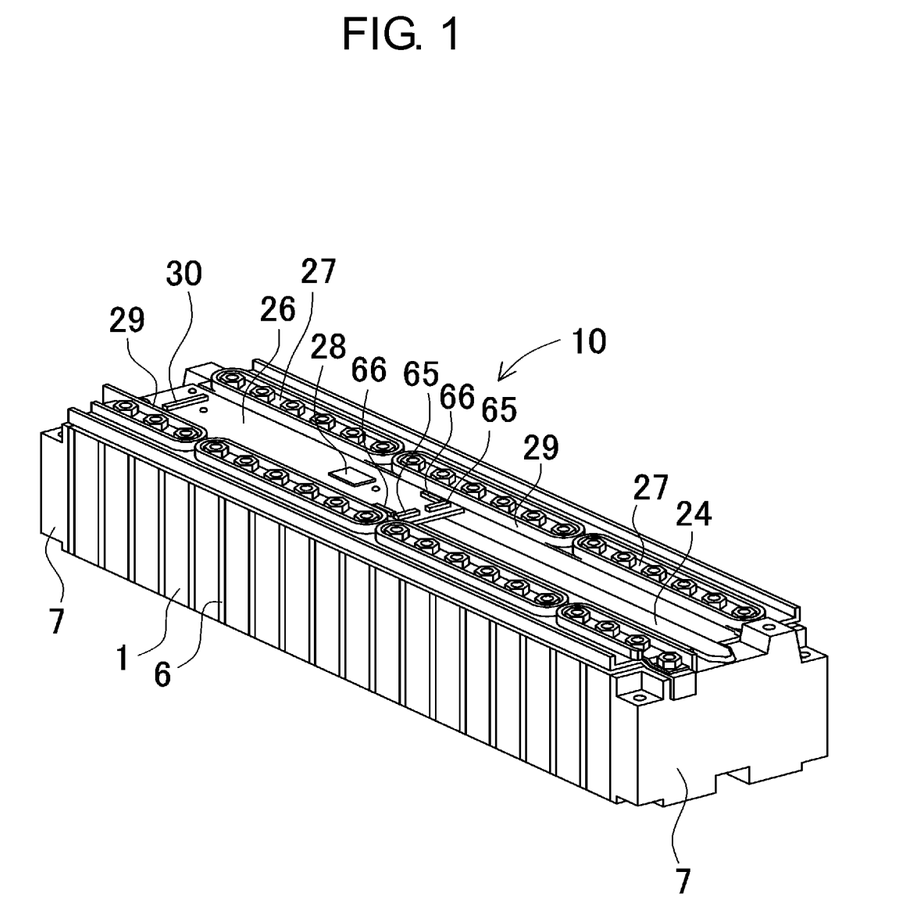
FIG. 1 is a perspective view showing an external appearance of a power supply device according to an embodiment
Figure 2:
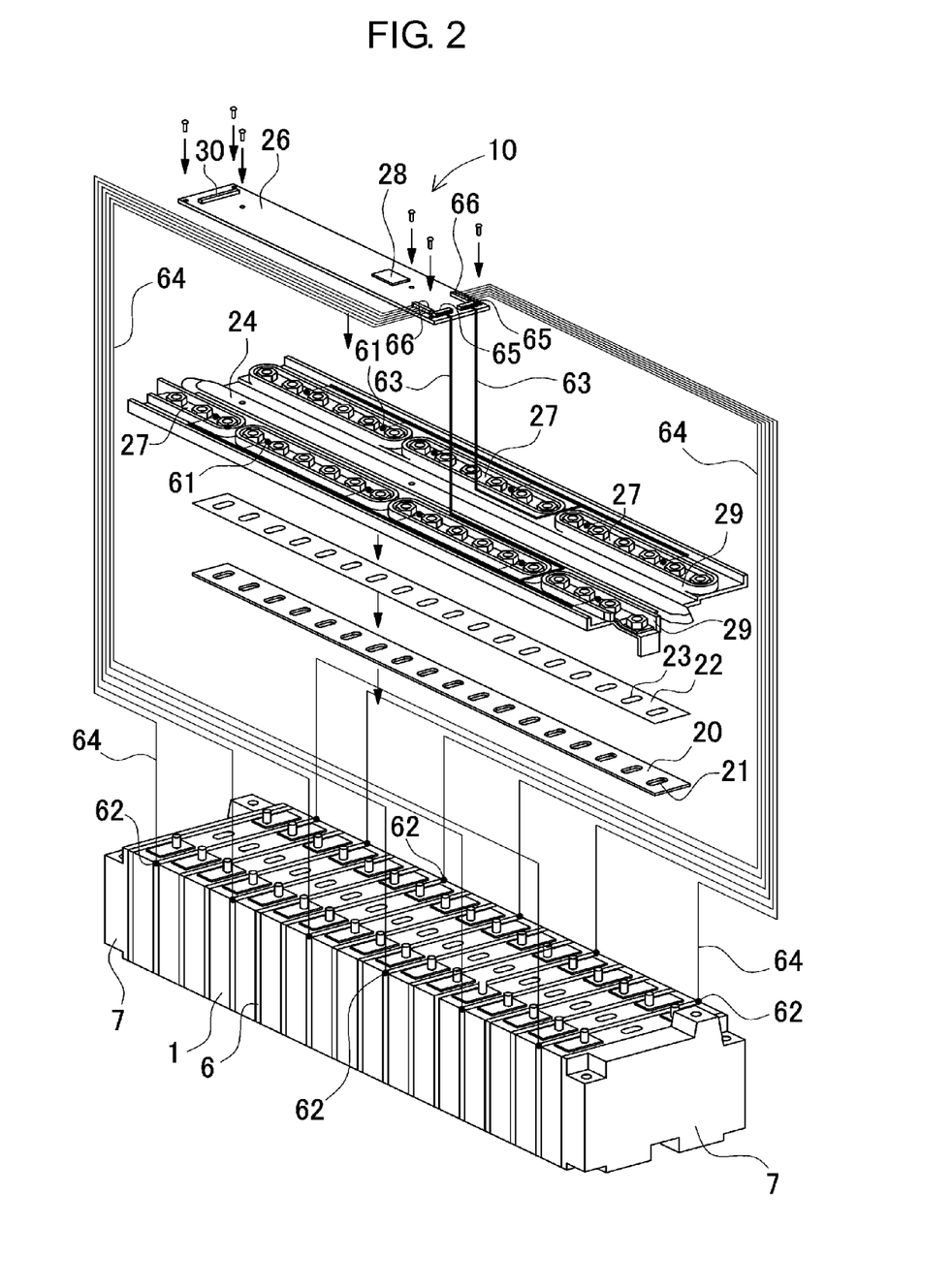
FIG. 2 is an exploded perspective view showing the disassembled power supply device of FIG. 1 in a state of removing pressure plates and sealing materials.
Figure 3:
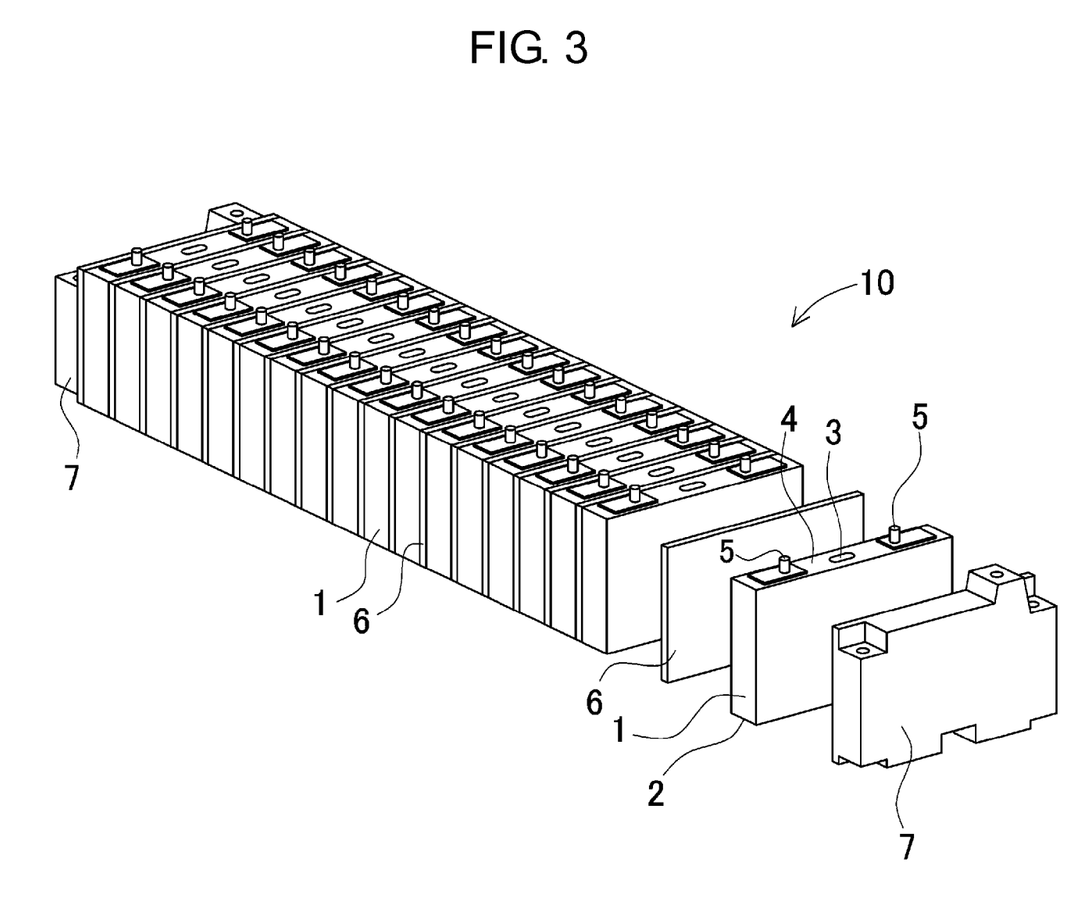
FIG. 3 is an exploded perspective view showing the disassembled power supply device of FIG. 1 in a state of removing a battery cell, a separator, and an endplate.

Based on FIGS. 1-3, the following describes an example of a power source apparatus used in an automotive application as the first embodiment. FIG. 1 shows an oblique view of the external appearance of a battery block 10 included in the power source apparatus, FIG. 2 shows an exploded oblique view with the safety valve gas duct 24, pressure plate 22, and sealing material 20 separated from the power source apparatus of FIG. 1, and FIG. 3 shows an exploded oblique view with a battery cell 1, separator 6, and endplate 7 separated from the power source apparatus of FIG. 1. As shown in FIG. 1, the battery block 10 has a box-shape. The power source apparatus is formed from a series and/or parallel connection of a plurality of these battery blocks 10. As shown in the exploded oblique view of FIG. 2, each battery block 10 is provided with a stack of a plurality of battery cells 1, sealing material 20, a pressure plate 22, and a safety valve gas duct 24. The safety valve gas duct 24 is connected with battery cell 1 safety valves 3.

(Battery Block 10)

As shown in the exploded oblique view of FIG. 3, a battery block 10 is a plurality of battery cells 1 stacked with intervening separators 6 and held together in a block form with endplates 7 disposed at both ends. The endplates 7 at the ends of the stack are fastened together by binding bars (not illustrated). The binding bars are disposed along the sides or top of the battery block 10. The binding bars are formed by bending sheet metal. By sandwiching and holding the battery cell 1 stack between endplates 7 bound together by binding bars, the battery block 10 structure can be retained in a robust manner.

(Battery Cell 1)

As shown in FIG. 3, a battery cell 1 employs a thin outline external case 2 having a thickness that is narrower than the lateral width of the upper surface. The external case 2 has approximately a box-shape with rounded corner regions. A sealing plate 4, which seals the upper surface of the external case 2 closed, is provided with a pair of protruding electrode terminals 5 and a safety valve 3 disposed between the electrode terminals 5. The safety valve 3 is configured to allow internal gas to be released in the event that pressure inside the external case 2 rises to a given value. The rise in pressure inside the external case 2 can be halted by opening the safety valve 3. In general, to efficiently route the gas discharged from any safety valve 3, battery cells 1 are stacked in a manner that lines-up the safety valves 3 along one surface (the upper surface in the present embodiment) of the battery block 10.

The batteries that serve as the battery cells 1 are rechargeable batteries such as lithium ion batteries, nickel hydride batteries, or nickel cadmium batteries. In particular, when thin outline lithium ion batteries are used, the power source apparatus has the characteristic that high charge capacity per overall volume can be attained.

(Circuit Board 26)

A circuit board 26 is disposed on top of the safety valve gas duct 24. The circuit board 26 carries circuitry such as protection circuitry that monitors parameters such as the temperature and voltage of the battery cells 1 that make up the battery block 10 and checks for abnormal conditions. By disposing the circuit board on top of the battery block in this manner, there is no interference in connection surface of the battery blocks 10 with the circuit board 26, and the structure is advantageous for reducing battery block size.

In the example shown in FIGS. 1 and 2, bus-bars 27 that connect the electrode terminals 5 of adjacent battery cells 1 are disposed on the upper surface of the battery block 10. Bus-bars 27 extend in the battery cell 1 stacking direction as a pair of parallel rows disposed on the upper surface of the battery block 10 with separation between the two rows. By disposing the circuit board 26 between the two separated rows of bus-bars 27, battery block 10 size increase is avoided. This is advantageous for reducing overall battery block and power source device size.

(Monitoring Circuit 28)

A monitoring circuit 28 monitors and determines states of the battery cells 1 based on battery property information detected in a plurality of monitoring portions connected to the battery cells 1. Such monitoring circuit 28 constitutes IC of ASI or the like. As the battery property information, a current or the like other than a temperature or a voltage of the battery cells 1 as mentioned above can be used. Regarding the voltage, not only a cell voltage but also a voltage of overall battery blocks or a voltage of connected battery cells in series is used as the battery property information.

(Monitoring Portion)

The battery cells are connected in three cells parallel and in six cells series by the bus-bars 27. In this embodiment, as monitoring portions, two of a first monitoring portion 61 and a second monitoring portion 62 are used. The first monitoring portion 61 is the monitoring terminal to detect the voltage of the battery cell 1. Here, the monitoring terminal is welded to bus-bars 27. Through the monitoring terminals, each of the electric potentials (voltages) of the bus-bars 27 which connect the battery cells is detected. And the monitoring circuit 28 as the IC of ASIC (Application Specific Integrated Circuit for detecting voltages) or the like computes the cell voltage by calculating the electric potential differences between the bus-bars 27 which connect the battery cells in series. Namely, the circuit board 26 has the voltage detecting circuit which computes the cell voltage as the monitoring circuit 28. Through a first harness 63 connected to the monitoring terminals, the electric potentials (voltages) of the bus-bars 27 which connect the battery cells are inputted into the voltage detecting circuit. Moreover, in the circuit board 26, an external output connector 30 is provided. Through the external output connector 30, the cell voltages which is computed by the voltage detecting circuit are outputted to an external circuit board or the like.

Additionally, the external output connector 30 is connected to signal lines (not shown in figures) connected to the external circuit board, and shortening the length of those signal lines can enhance noise immunity in the same as the first harness 63 or a second harness 64. Therefore, as shown in FIG. 2, preferably, the external output connector 30 connected to the signal lines is disposed at the peripheral portion (namely, the side area) of the circuit board 26 having the monitoring circuit 28, and in this embodiment the external output connector 30 is disposed at the side area of the opposite side of the first connector 65 of the circuit board 26 as mentioned below.

Further, the second monitoring portion 62 is a temperature sensor which detects a temperature of the battery cell. As such temperature sensor, a PTC, a thermistor, or the like can be used. Here, the thermistor is used, and the temperature of the battery cell 1 is detected as variation of resistance value, and is inputted into the monitoring circuit 28. In the power supply device shown in the exploded perspective view of FIG. 2, temperature sensor 12 detecting the temperature of the battery cell 1 is disposed in contact with or close to the battery cell 1. Moreover, as the thermistor, a NTC thermistor, a PTC thermistor, or the like is used. And in place of the thermistor, a thermocouple, a varistor and the like can be used. In addition, the temperature sensor can be disposed so as to detect not only the temperature of the battery cell but also the temperature of other members of the bus-bar, the circuit board, or the like.

The first monitoring portion 61 and the second monitoring portion 62 are each electrically connected to the monitoring circuit 28 in the circuit board 26 via the first harness 63 and the second harness 64. Moreover, in the circuit board 26 the first connector 65 and a second connector 66 are provided in order to be connected to the first harness 63 and the second harness 64. Namely, one ends of the first harness 63 are fixed and each connected to the bus-bars 27, and the first harness 63 has first connecting terminals in the other ends thereof. Further, the plurality of the first connecting terminals in the first harness 63 are collectively connected to a first connecting connector such that the plurality of the first connecting terminals are efficiently connected to the circuit board 26.

The first connecting connector has a press fit structure in which the first connecting connector and the first connector 65 are press-fitted, and by the first connecting connector being press-fitted to the first connector 65, the plurality of the first connecting terminals of the first harness 63 are connected to the circuit board 26. Then, in the same way, one ends of the second harness 64 are each connected to the temperature sensors, and the other ends of the second harness 64 are second connecting terminals. A second connecting connector to which the second connecting terminals are collectively connected is press-fitted to the second connector 66.

Each of the connectors and the connecting connectors is made of insulating material. Then, in the embodiment shown in FIG. 4, the first connectors 65 and the second connectors 66 each constitute two pieces. Instead, needless to say, one piece or equal to or more than three pieces as the first connector 65 or the second connector 66 can be available. Moreover, when the press fit structure of the first connector 65 is not compatible with the press fit structure of the second connector 66, it prevents misconnection.

Figure 4:
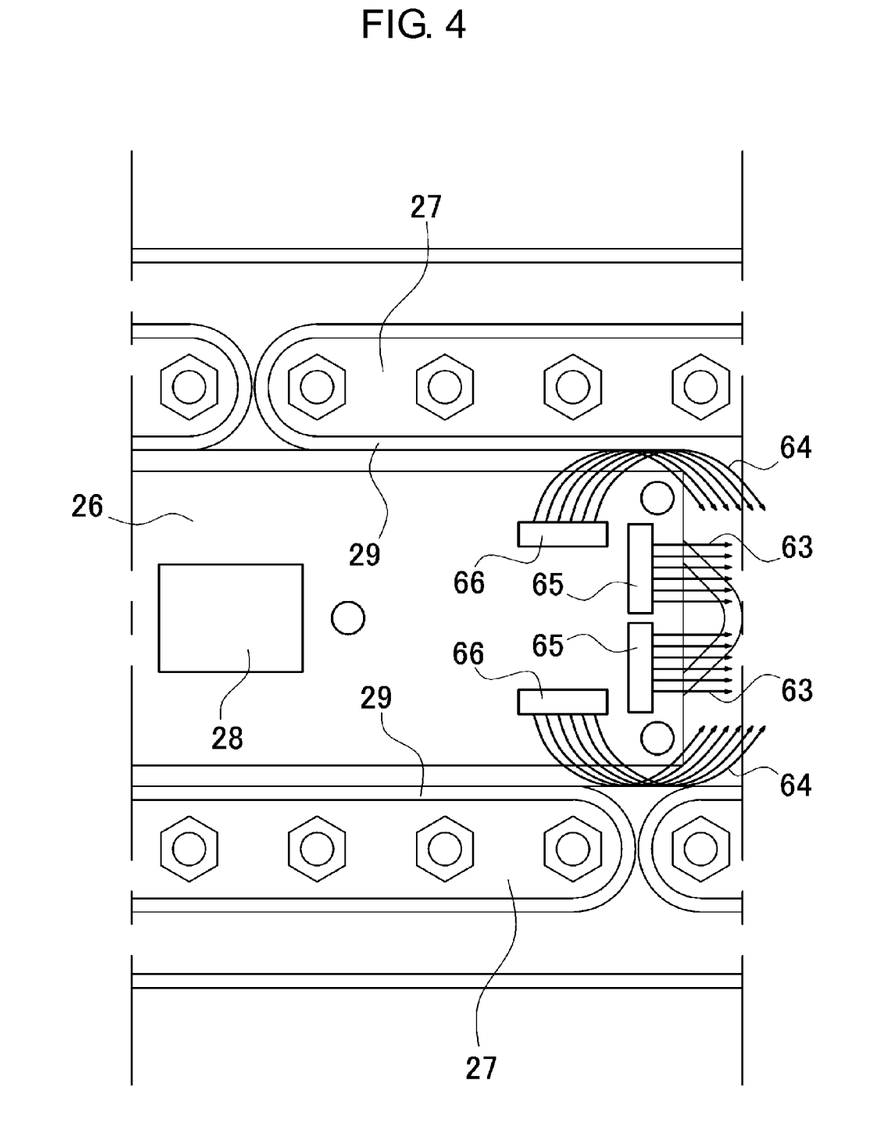
FIG. 4 is a plan view showing a circuit board of the power supply device in FIG. 1.

The plan view of the circuit board 26 is shown in FIG. 4. The circuit board 26 has a rectangular shape in the external appearance, and is, for example, a multilayer board made of glass epoxy, the circuit board 26 has screw holes at the four corners thereof in order to fix it to the upper surface of the battery block 10 by screws.

(Connector)

In addition, the first connectors 65 are disposed at and fixed to the peripheral portion (namely, the side area or the side) in the short side of the rectangular shape in the circuit board 26. In this embodiment, the first connectors 65 are divided in two. Needless to say, the long connector as a single piece can be available.

Further, the second connectors 66 are disposed at and fixed to the peripheral portion (namely, the side area or the side) in the long side of the rectangular shape in the circuit board 26 adjacent to the first connectors 65. In this embodiment of FIG. 4, the second connectors 66 are each disposed at both sides of the short side where the first connectors 65 are provided. By such disposition of the connectors, the connectors having the increased number of the terminals are efficiently disposed without enlarging the circuit board 26.

In order to enhance noise immunity, shortening the length of the harnesses is required. Accordingly, it is necessary that the connectors are disposed at the side of the circuit board. However, according to the demands on the enhancement of capacity, the number of secondary battery cells increase. On the other hand, as there are the demands on downsizing the power source device, it is difficult to increase in the size of the circuit board. As a result, the length of the side in the circuit board does not have enough space or area to dispose the connectors corresponding to the number of the harnesses. Therefore, as shown in FIG. 11 and FIG. 12, the connectors have to be disposed side by side at the peripheral portion (namely, the side area) of the circuit board. In this double disposition of the connecters, the first harness 963 extended from the first connector 965 disposed near the side is available without problem, but the second harness 964 disposed at the inside of the first connector 965 is extended to the outside beyond the upper surface of the first connector 965. In order to avoid the interference between the second harness 964 and the first connector 965, enough space is necessary around the first connector 965 such that the second harness 964 passes beyond the upper surface of the first connector 965. Namely, space is necessary above the upper surface of the first connector 965 such that the connector or the harness can pass through it, and space is necessary between the first connector 965 and the second connector 966 such that the second harness 964 can be extended. Therefore, the second connector 966 cannot be disposed close to the first connector 965, and the large disposing area of the connector is necessary, then as a result, there is a problem of increasing in the size of the power supply device.

In contrast, in this embodiment, the second connector 66 is fixed to another side crossing the one side where the first connector 65 is disposed. Accordingly, by disposing the connector at the side, noise immunity is enhanced, and the increased number of the harnesses are available. In the embodiment of FIG. 4, the first connectors 65 are disposed and fixed at the peripheral portion (namely, the side area) in the short side of the rectangular shape in the circuit board 26, and the second connectors 66 are disposed and fixed at the peripheral portion (namely, the side area) in the long side. As a result, the first connectors 65 are at a position thereof crossing the second connectors 66 at right angle. The second harnesses 64 extended from the second connector 66 can be extended toward the long side, and as shown in FIG. 4 extended toward in the same direction as the first harnesses 63. Especially, as shown in FIG. 1 or FIG. 2, in the structure in which the circuit board 26 is disposed between the bus-bars 27 on both ends on the upper surface of the battery block 10, separating walls 29 are disposed in order to insulate the bus-bars 27 and the circuit board 26. Therefore, the second harnesses 64 are bent at a position like the separating walls 29 reflecting the second harnesses 64, and in the same direction as the first harnesses 63, namely, are extended toward the first connector 65. By this structure, the second connectors 65 are fixed at the position thereof crossing the first connector 65, then the second harness 64 and the first harness 63 are extended in the same direction, as a result, preventing the double disposition of the connecters, the harnesses are collectively extended from the one side of the circuit 26 like the conventional example.

Further, fixing at the crossing position means that the first connectors 65 and the second connectors 66 are disposed in the different directions such that the harnesses connected to the connectors do not interfere each other, then the first connector 65 and the second connector 66 are disposed closely. Namely, that include a structure in which the first connector 65 and the second connector 66 are disposed in spaced relationship.

Moreover, in the embodiment of FIG. 4, the second connectors 66 are disposed on both long sides in the circuit board 26. By disposing the connectors on the facing side in the circuit board 26, the connectors corresponding to more harnesses can be disposed.

And in the embodiment of the present invention, the first connector, the second connector, and the external output connector are not the type of fitting detachably in the vertical direction to the main surface of the circuit board like the general connector, but are the type of fitting detachably in the horizontal direction. By using this type of the connector, the height In the vertical direction to the circuit board can be small, and the overall power source device can be prevented from increasing in its size.

Figure 5:
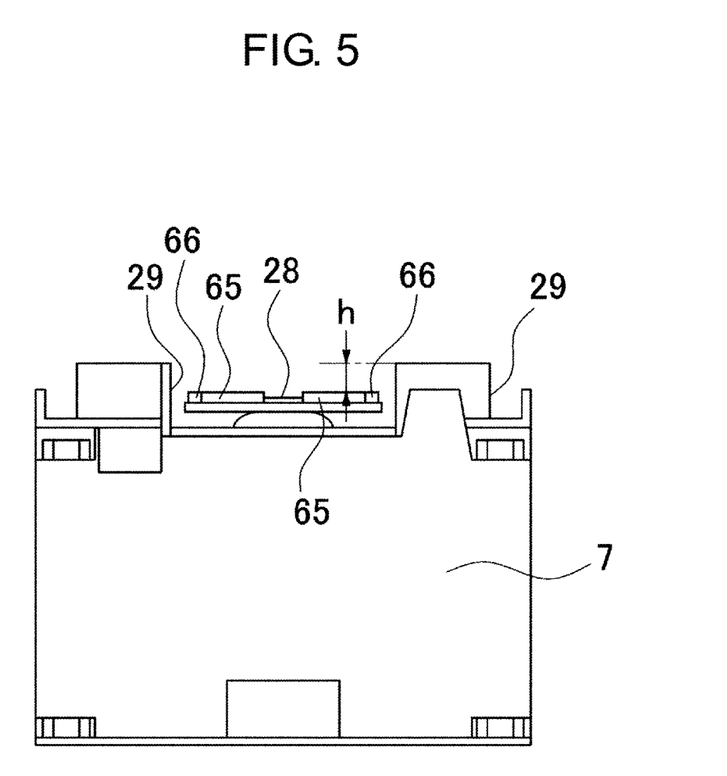
FIG. 5 is a rear view showing a circuit board of the power supply device in FIG. 1.
Figure 6:
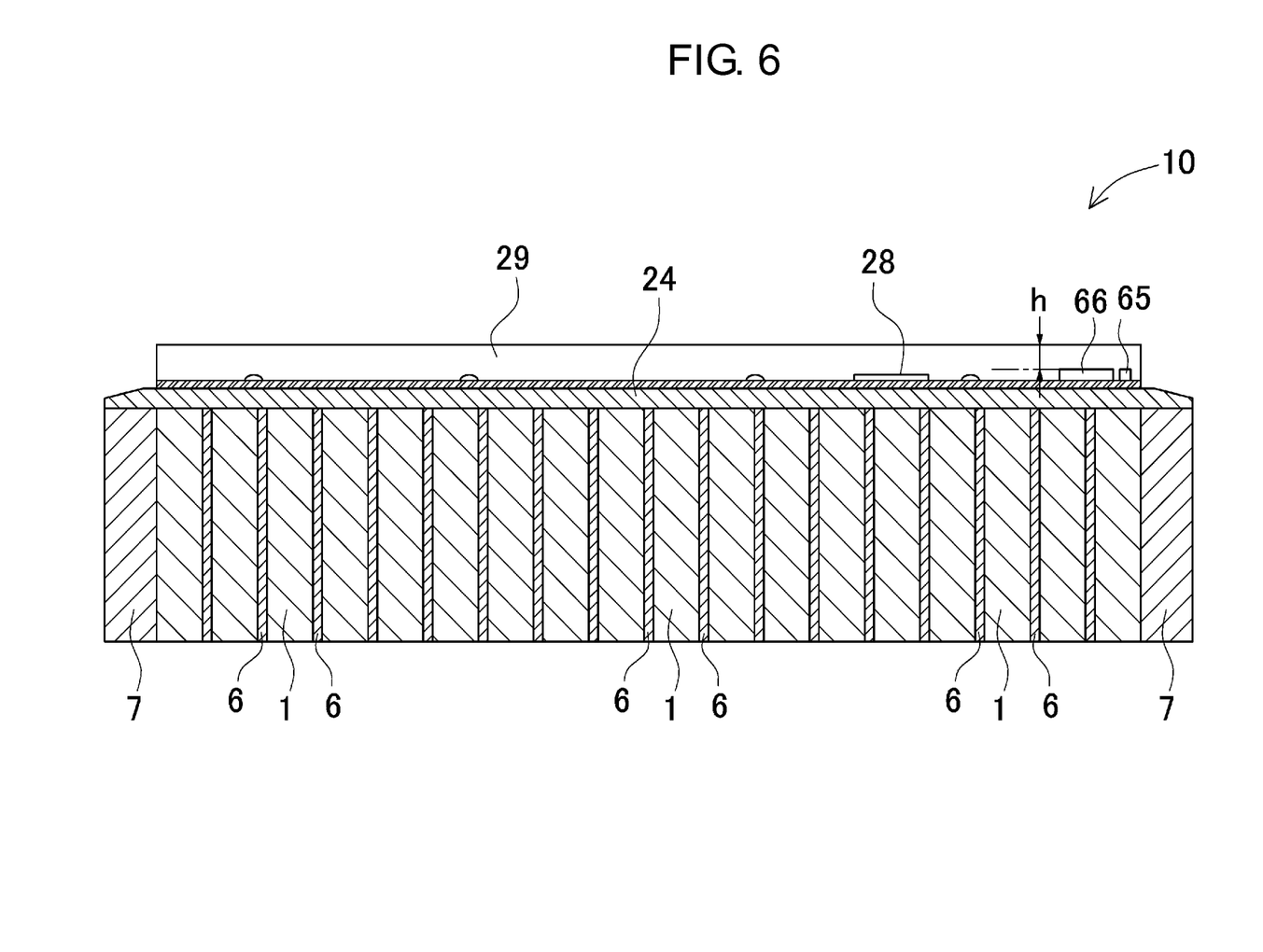
FIG. 6 is a cross-sectional view of the power supply device in FIG. 1.

Further, as shown in the rear view of FIG. 5 and the cross-sectional view of FIG. 6, preferably, the heights of the first connectors 66 and the second connectors 66 are lower than the heights of the separating walls 29. This structure prevent the first connectors 65, the second connectors 66, and connecting portions to the first harnesses and the second harnesses connected to these from projecting from the electrode terminals 5 of the battery cell 1 and the separating walls 29 holding the bus-bars 27. Therefore, increasing in the height of the power supply device is avoided.

In the embodiment of FIG. 4, the circuit board 26 has screw holes at the four corners thereof in order to fix it to the upper surface of the battery block 10 by screws. Here, the projections of screw heads or the like projecting from the screw holes can be disposed between the second harnesses 64 and the first harnesses 63. By this structure, the second harnesses 64 can be extended through the outside of the screws, then entangling the second harnesses 64 and the first harnesses 63 can be avoided. Therefore, the extended harnesses can be easily dispatched between the connectors.

Further, in the disclosure of this invention, the harness means not only the connecting cable bundling plural lead wires but also, for example, the structure of the connector connecting each of lead wires, hard wires, or the like.

The aforementioned power supply devices can be used as a power supply for vehicles. The power supply device can be installed on electric vehicles such as hybrid cars that are driven by both an internal-combustion engine and an electric motor, and electric vehicles that are driven only by an electric motor. The power supply device can be used as a power supply device for these types of vehicles.

(Hybrid Car Power Supply Device)

Figure 7:
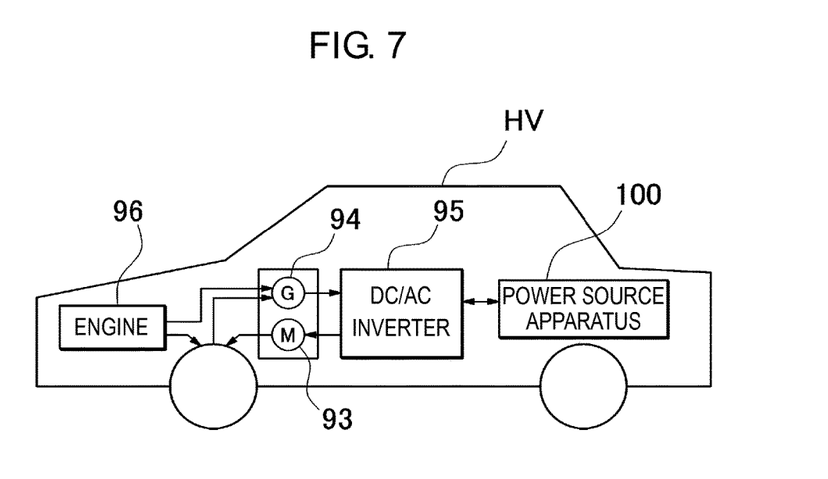
FIG. 7 is a block diagram showing one explanatory embodiment of a hybrid car driven by an engine and a motor in which the power supply device is installed.

FIG. 7 is a block diagram showing an exemplary hybrid car that is driven both by an engine and an electric motor, and includes the power supply device. The illustrated vehicle HV with the power supply device includes an electric motor 93 and an internal-combustion engine 96 that drive the vehicle HV, a power supply device 100 that supplies electric power to the electric motor 93, and an electric generator 94 that charges batteries of the power supply device 100. The power supply device 100 is connected to the electric motor 93 and the electric generator 94 via a DC/AC inverter 95. The vehicle HV is driven both by the electric motor 93 and the internal-combustion engine 96 with the batteries of the power supply device 100 being charged/discharged. The electric motor 93 is energized with electric power and drives the vehicle in a poor engine efficiency range, e.g., in acceleration or in a low speed range. The electric motor 93 is energized by electric power that is supplied from the power supply device 100. The electric generator 94 is driven by the engine 96 or by regenerative braking when users brake the vehicle so that the batteries of the power supply device 100 are charged.

(Electric Vehicle Power Supply Device)

Figure 8:
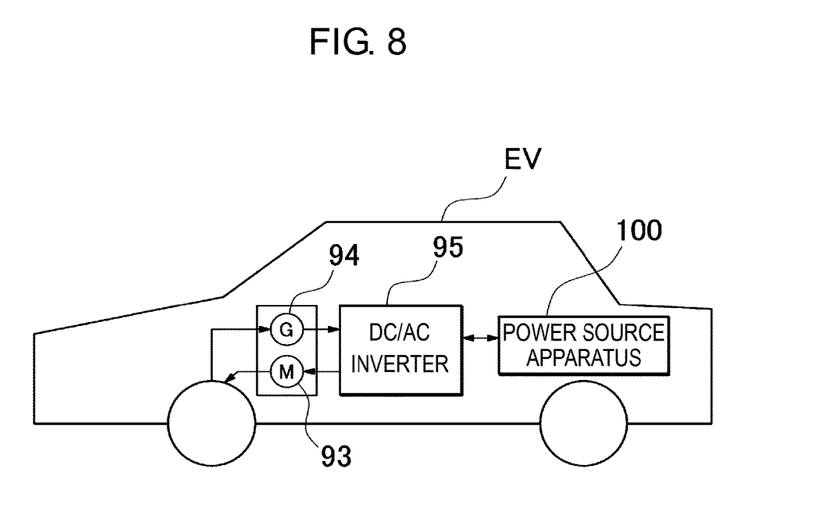
FIG. 8 is a block diagram showing one explanatory embodiment of an electric car driven only by a motor in which the power supply device is installed.

FIG. 8 shows an exemplary electric vehicle that is driven only by an electric motor, and includes the power supply device. The illustrated vehicle EV with the power supply device includes the electric motor 93, which drives the vehicle EV, the power supply device 100, which supplies electric power to the electric motor 93, and the electric generator 94, which charges batteries of the power supply device 100. The electric motor 93 is energized by electric power that is supplied from the power supply device 100. The electric generator 94 can be driven by vehicle EV regenerative braking so that the batteries of the power supply device 100 are charged.

(Power Storage Type Power Supply Device)

Figure 9:
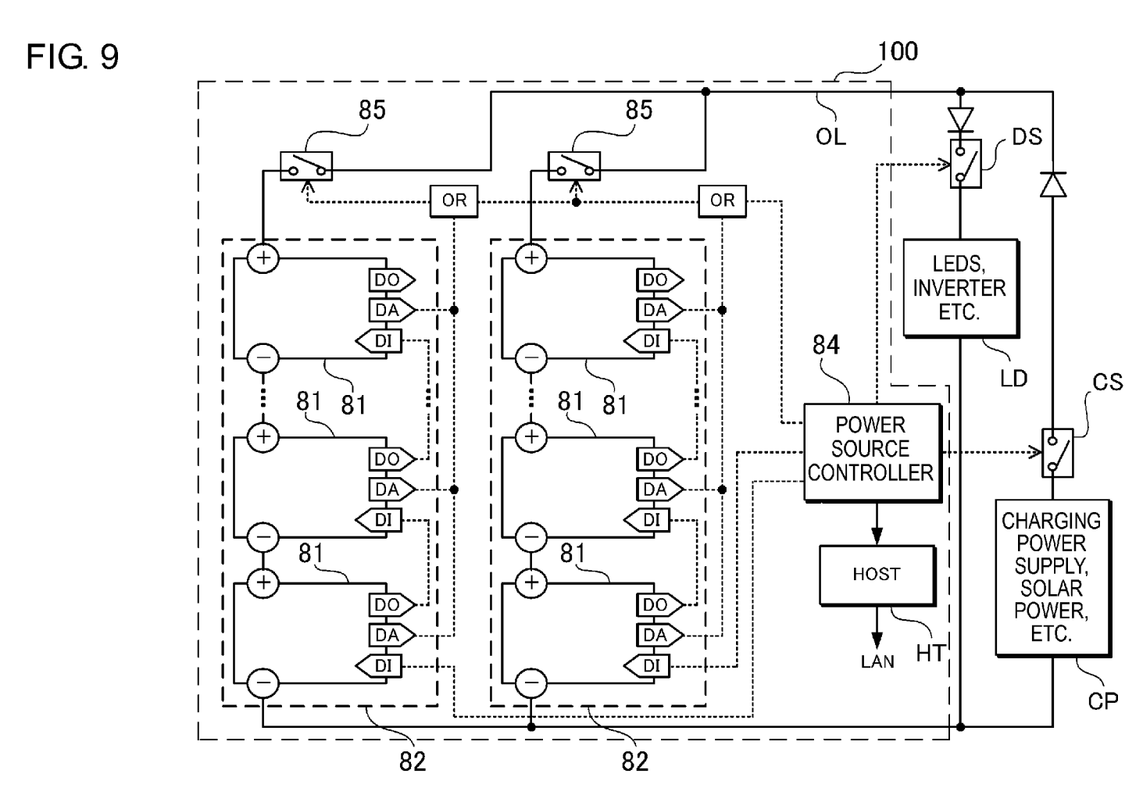
FIG. 9 is a block diagram showing one explanatory embodiment of a storage battery device using the power supply device.

The power supply device can be used not only as power supply of mobile unit but also as stationary power storage. For example, examples of stationary power storage devices can be provided by an electric power system for home use or plant use that is charged with sunlight or with midnight electric power and is discharged when necessary, a power supply for street lights that is charged with sunlight during the daytime and is discharged during the nighttime, or a backup power supply for signal lights that drives signal lights in the event of a power failure. FIG. 25 shows an exemplary circuit diagram. This illustrated power supply device 100 includes battery units 82 each of which includes a plurality of battery packs 81 that are connected to each other. In each of battery packs 81, a plurality of rectangular battery cells 1 are connected to each other in serial and/or in parallel. The battery packs 81 are controlled by a power supply controller 84. In this power supply device 100, after the battery units 82 are charged by a charging power supply CP, the power supply device 100 drives a load LD. The power supply device 100 has a charging mode and a discharging mode. The Load LD and the charging power supply CP are connected to the power supply device 100 through a discharging switch DS and a charging switch CS, respectively. The discharging switch DS and the charging operation switch CS are turned ON/OFF by the power supply controller 84 of the power supply device 100. In the charging mode, the power supply controller 84 turns the charging operation switch CS ON, and turns the discharging switch DS OFF so that the power supply device 100 can be charged by the charging power supply CP. When the charging operation is completed so that the battery units are fully charged or when the battery units are charged to a capacity not lower than a predetermined value, if the load LD requests electric power, the power supply controller 84 turns the charging operation switch CS OFF, and turns the discharging switch DS ON. Thus, operation is switched from the charging mode to the discharging mode so that the power supply device 100 can be discharged to supply power to the load LD. In addition, if necessary, the charging operation switch CS may be turned ON, while the discharging switch DS may be turned ON so that the load LD can be supplied with electric power while the power supply device 100 can be charged.

The load LD driven by the power supply device 100 is connected to the power supply device 100 through the discharging switch DS. In the discharging mode of the power supply device 100, the power supply controller 84 turns the discharging switch DS ON so that the power supply device 100 is connected to the load LO. Thus, the load LD is driven with electric power from the power supply device 100. Switching elements such as FET can be used as the discharging switch DS. The discharging switch DS is turned ON/OFF by the power supply controller 84 of the power supply device 100. The power supply controller 84 includes a communication interface for communicating with an external device. In the exemplary power supply device shown in FIG. 25, the power supply controller is connected to a host device HT based on existing communications protocols such as UART and RS-232C. Also, the power supply device may include a user interface that allows users to operate the electric power system if necessary.

Each of the battery packs 81 includes signal terminals and power supply terminals. The signal terminals include a pack input/output terminal DI, a pack abnormality output terminal DA, and a pack connection terminal DO. The pack input/output terminal DI serves as a terminal for providing/receiving signals to/from other battery packs and the power supply controller 84. The pack connection terminal DO serves as a terminal for providing/receiving signals to/from other battery packs as slave packs. The pack abnormality output terminal DA serves as a terminal for providing an abnormality signal of the battery pack to the outside. Also, the power supply terminal is a terminal for connecting one of the battery packs 81 to another battery pack in series or in parallel. In addition, the battery units 82 are connected to an output line OL through parallel connection switches 85, and are connected in parallel to each other.

INDUSTRIAL APPLICABILITY

A power supply device, a circuit board, a vehicle and a storage battery device equipped with the power supply device according to the present invention can be suitably used as power supply devices of plug-in hybrid vehicles and hybrid electric vehicles that can switch between the EV drive mode and the HEV drive mode, electric vehicles, and the like. A vehicle including this power supply device according to the present invention can be suitably used as plug-in hybrid vehicles, hybrid electric vehicles, electric vehicles, and the like. Also, a power supply device according to the present invention can be suitably used as backup power supply devices that can be installed on a rack of a computer server, backup power supply devices for wireless communication base stations, electric power storages for home use or plant use, electric power storage devices such as electric power storages for street lights connected to solar cells, backup power supplies for signal lights, and the like.

The invention claimed is:

1. A power supply device comprising:
    a battery block having a plurality of stacked battery cells;
    a first monitoring portion monitoring one battery property of the plurality of the battery cells constituting the battery block;
    a second monitoring portion monitoring another battery property of the plurality of the battery cells constituting the battery block;
    a circuit board having a monitoring circuit being connected to the first monitoring portion and the second monitoring portion, the monitoring circuit monitoring states of the battery cells based on each of battery property information detected in the first monitoring portion and the second monitoring portion, and having a rectangular shape in the external appearance;
    a first connector detachably connecting a first harness including wires extended from the first monitoring portion to the monitoring circuit, having a rectangular shape in a plan view; and
    at least one second connector detachably connecting a second harness including wires extended from the second monitoring portion to the monitoring circuit, having a rectangular shape in a plan view;
    wherein the first connector is fixed to a first side of the rectangular shape of the circuit board such that a long side of the rectangular shape of the first connector is adjacent to the first side of the rectangular shape of the circuit board, and the second connector is fixed to a second side of the rectangular shape of the circuit board that is perpendicular to the first side of the rectangular shape of the circuit board such that a long side of the rectangular shape of the second connector is adjacent to the second side of the rectangular shape of the circuit board and perpendicular to the long side of the rectangular shape of the first connector.

2. The power supply device according to claim 1, wherein the battery property information is at least one of a temperature or a voltage of the battery cells.

3. The power supply device according to claim 1, wherein the circuit board has an elongated rectangular shape in one direction in the rectangular shape, and the first connector is positioned at an end side in the elongated direction, and the second connector is positioned at a side adjacent to the end side in the elongated direction.

4. The power supply device according to claim 1, wherein a plurality of the second connectors are provided at facing sides of the circuit board.

5. The power supply device according to claim 1, wherein the second harness and the first harness are bent in the same direction.

6. The power supply device according to claim 1, wherein the first connector detachably connects the first harness in a horizontal direction to a surface of the circuit board,
    and the second connector detachably connects the second harness in the horizontal direction to the surface of the circuit board.

7. A vehicle comprises the power supply device according to claim 1.

8. A storage battery device comprises the power supply device according to claim 1.

9. A circuit board being connectable to at least two monitoring portions monitoring battery property, comprising:
    a monitoring circuit being connectable to at least two monitoring portions, the monitoring circuit monitoring states of the battery cells based on battery property information detected in each monitoring portion;
    a first connector detachably connecting a first harness including wires and connecting terminals at an end thereof extended from the one monitoring portion to the circuit board, having a rectangular shape in a plan view; and
    a second connector detachably connecting a second harness including wires and connecting terminals at an end thereof extended from the one other monitoring portion to the circuit board, having a rectangular shape in a plan view,
    wherein the circuit board has a rectangular shape in the external appearance, and the first connector is fixed to a first side of the rectangular shape of the circuit board such that a long side of the rectangular shape of the first connector is adjacent to the first side of the rectangular shape of the circuit board, and the second connector is fixed to a second side of the rectangular shape of the circuit board that is perpendicular to the first side of the rectangular shape of the circuit board such that a long side of the rectangular shape of the second connector is adjacent to the second side of the rectangular shape of the circuit board and perpendicular to the long side of the rectangular shape of the first connector.

10. A vehicle comprises the circuit board according to claim 9.

11. A storage battery device comprises the circuit board according to claim 9.

12. The power supply device according to claim 9, wherein the first connector detachably connects the first harness in a horizontal direction to a surface of the circuit board,
    and the second connector detachably connects the second harness in the horizontal direction to the surface of the circuit board.

* * * * *